(12) United States Patent
Dworski et al.

(10) Patent No.: US 7,912,667 B2
(45) Date of Patent: Mar. 22, 2011

(54) ELECTRICAL CIRCUIT AND METHOD FOR TESTING ELECTRONIC COMPONENT

(75) Inventors: Claus Dworski, Villach (AT); Sebastian Sattler, München (DE)

(73) Assignee: Infineon Technologies AG, Munich (DE)

( * ) Notice: Subject to any disclaimer, the term of this patent is extended or adjusted under 35 U.S.C. 154(b) by 882 days.

(21) Appl. No.: 10/564,650

(22) PCT Filed: Jun. 4, 2004

(86) PCT No.: PCT/DE2004/001148
§ 371 (c)(1),
(2), (4) Date: Aug. 7, 2006

(87) PCT Pub. No.: WO2005/008896
PCT Pub. Date: Jan. 27, 2005

(65) Prior Publication Data
US 2007/0063723 A1 Mar. 22, 2007

(30) Foreign Application Priority Data
Jul. 14, 2003 (DE) .................................. 103 32 008

(51) Int. Cl.
*G01R 31/00* (2006.01)
*G01R 31/14* (2006.01)
(52) U.S. Cl. ........................................................ 702/117
(58) Field of Classification Search ................... 702/57, 702/58, 64, 65, 72, 79, 117, 118, 183, 185, 702/85, 106, 107; 324/76.11, 763, 765
See application file for complete search history.

(56) References Cited

U.S. PATENT DOCUMENTS

| 3,852,123 | A | | 12/1974 | Goltz |
| 4,641,246 | A | * | 2/1987 | Halbert et al. ................. 341/163 |
| 4,746,902 | A | | 5/1988 | Tol et al. |
| 4,890,095 | A | | 12/1989 | Esser et al. |
| 5,029,289 | A | * | 7/1991 | Utsumi et al. ................... 345/25 |
| 5,063,383 | A | * | 11/1991 | Bobba ............................ 341/120 |
| 5,175,547 | A | * | 12/1992 | Lyon et al. ..................... 341/120 |
| 5,266,951 | A | * | 11/1993 | Kuegler et al. ................ 341/120 |
| 5,748,124 | A | | 5/1998 | Rosenthal et al. |

(Continued)

FOREIGN PATENT DOCUMENTS
DE 19750321 5/1998
(Continued)

OTHER PUBLICATIONS

A.K. Lu, G.W. Roberts, "An Analog Multi-Tone Signal Generator for Built-In Self-Test Applications", ITC 1994 Proceedings, Baltimore, USA Paper 27.3, pp. 650-659.

(Continued)

*Primary Examiner* — Michael P Nghiem
(74) *Attorney, Agent, or Firm* — Dicke, Billig & Czaja, P.L.L.C.

(57) ABSTRACT

An electrical test circuit is disclosed. In one embodiment, the electrical test circuit includes a first input for receiving a test signal of an integrated circuit, a second input for receiving a control signal and a third input for receiving a normalized reference signal, particularly one that is formed to be synchronous with the test signal. Using a control device of the electrical test circuit, the deviation and/or the amplitude and/or the phase of the reference signal and/or of the test signal can be varied. A measuring device generates, by subtracting the reference signal from the test signal, a difference signal which is output via an output.

14 Claims, 4 Drawing Sheets

U.S. PATENT DOCUMENTS

| | | | |
|---|---|---|---|
| 6,107,890 A * | 8/2000 | Carson et al. | 331/17 |
| 6,127,869 A | 10/2000 | Hirasaka | |
| 6,188,253 B1 | 2/2001 | Gage et al. | |
| 6,326,909 B1 | 12/2001 | Yamaguchi | |
| 6,417,682 B1 * | 7/2002 | Suzuki et al. | 324/755 |
| 6,457,148 B1 | 9/2002 | Yoshiba | |
| 6,606,575 B2 * | 8/2003 | Miller | 702/104 |
| 6,781,398 B2 * | 8/2004 | Adler et al. | 324/765 |
| 6,882,139 B2 * | 4/2005 | Grebner et al. | 324/158.1 |
| 7,355,472 B2 * | 4/2008 | Kranz | 330/10 |
| 2002/0079938 A1 * | 6/2002 | Saeki | 327/165 |
| 2002/0105353 A1 | 8/2002 | Mori et al. | |
| 2005/0246598 A1 * | 11/2005 | Minzoni | 714/724 |

FOREIGN PATENT DOCUMENTS

| | | | |
|---|---|---|---|
| DE | 19823503 | | 12/1998 |
| DE | 10028835 | | 7/2001 |
| EP | 0224707 | A1 | 6/1987 |
| EP | 0 550 187 | | 7/1993 |
| WO | 2005008896 | * | 1/2005 |

OTHER PUBLICATIONS

A.K. Lu, G.W. Roberts, D.A. Johns, "A High-Quality Analog Oscillator Using Oversampling D/A Conversion Techniques", ISCAS 1993 Proceedings, Chicago, May 1993, pp. 1298-1301.

A.K. Lu, G.W. Roberts, D.A. Johns, "A High-Quality Analog Oscillator Using Oversampling D/A Conversion Techniques", IEEE Trans. On Circuits and Systems—II: Analog and Digital Signal Processing, vol. 41, No. 7, Jul. 1994.

M. Hafed, G. Roberts, "Test and Evaluation of Multiple Embedded Mixed-Signal Test Cores", ITC 2002 Proceedings, Baltimore, USA, Paper 35.3, pp. 1022-1030.

T.A. Rebold, F.H. Irons: "A phase-plane approach to the compensation of high-speed analog-to-digital converters" IEEE International Symposium on Circuits and Systems XP 008036387, 1987.

Hofner T.C.: "INL/DNL Measurements for High-Speed ADCS" XP000947286, Dec. 1999.

* cited by examiner

ELECTRICAL CIRCUIT AND METHOD FOR TESTING ELECTRONIC COMPONENT

CROSS-REFERENCE TO RELATED APPLICATIONS

This Utility Patent Application claims the benefit of the filing date of Application No. DE 103 32 008.3, filed Jul. 14, 2003 and International Application No. PCT/DE2004/001148 filed Jun. 4, 2004, both of which are herein incorporated by reference.

FIELD OF THE INVENTION

The invention relates to an electrical circuit and to a method for testing electronic components.

BACKGROUND

When electronic components are tested, testers are frequently used which are equipped with the electronic components to be tested. These testers generate a wave-shaped test signal which is applied to the electronic component to be tested in each case. In dependence on this input signal, the electronic component generates a dynamic digital response in the form of a data record which can be checked in various ways.

One possibility for evaluating this data record is represented by the evaluation in the frequency domain, for example by means of a Fourier transform. However, this evaluation uses a large amount of computing power and cannot, therefore, be executed during the run time of the test.

A further possibility for evaluating the data record generated by the electronic component is represented by the evaluation in the time domain.

The computing method of sine wave fitting represents one evaluation method conceivable in this respect. The sine wave fitting method, too, requires a considerable amount of computing power. The data acquired cannot be evaluated during the run time, either. Instead, the entire data record must first be acquired and then supplied to a postprocessing unit. This is associated with a long measuring time and high measuring costs.

An alternative method for evaluation in the time domain is represented by the use of digital filters, the complexity of which, however, is relatively high.

The use of such digital filters necessitates high amounts of circuit area. The circuit area needed for digital filters is frequently larger than the circuit area for the electronic components to be tested.

For these and other reasons, there is a need for the present invention.

SUMMARY

The present invention provides an electrical circuit and a method by means of which reliable and accurate measurement and evaluation of the data supplied by an electronic component to be tested in the time domain is made possible economically and with only little computing power.

In one embodiment, the invention provides an electrical test circuit for testing integrated circuits. In principle, the test circuit according to the invention can be used for testing any integrated circuits but it is particularly well suited to testing dynamic analog/digital converters, or A/D converters, respectively, and Sigma/Delta converters.

In one embodiment, the test circuit according to the invention receives a test signal of an integrated circuit to be tested via a first input, a control signal via a second input and a normalized reference signal, particularly one that is formed to be synchronous with the test circuit, via a third input. Such a normalized ideal reference signal can be generated with only little effort by a conventional tester used during a test of integrated circuits.

In one embodiment the test circuit according to the invention also comprises a control device which can precisely adjust the deviation, the amplitude and the phase of the reference signal or the test signal. In this context, in particular, this control device is constructed as control loop which can be produced much more simply and inexpensively than a higher-order digital filter. In this arrangement, the deviation from the zero value or, respectively, the offset, the amplitude and the phase of the reference signal can be adapted, for example. It is also possible to correct the test signal with respect to its deviation and the reference signal with respect to its amplitude and phase.

Furthermore, the test circuit according to the invention has a measuring device by means of which the reference signal can be subtracted from the test signal in such a manner that a difference signal is produced which essentially corresponds with the noise component of the test signal. The electrical test circuit can completely remove the tone in the test signal by means of the reference signal without influencing the amplitude of the noise signal contained. According to the invention, this subtraction can take place during the run time.

From the remaining noise component of the test signal of the integrated circuit tested, certain quality parameters can be generated. Such quality parameters can be the standard deviation of the test signal, the deviation of the test signal and the amplitude of the test signal. Providing a number of different quality parameters makes it possible to provide reliable information about the functionality of an integrated circuit.

According to a basic concept of the invention, signal and noise of the integrated circuit tested can be separated in the time domain without elaborate mathematical computing methods by the electrical test circuit according to the invention. It is possible to completely avoid elaborate evaluations in the frequency domain. The Fourier transform, which consumes an extremely high amount of computing time and, therefore, cannot be performed "at speed", can also be avoided. By "at speed" is meant the evaluation during the performance of the actual test.

According to a further basic concept of the invention, various variables which represent a measure of the functional capability of the tested integrated circuit can be calculated from the difference signal formed and from the quality parameters generated. These are the signal to noise ratio SNR of the test signal, the signal to noise and distortion ratio of the test signal SNDR, the total unadjusted error TUE of the test signal and the total adjusted error TAE of the test signal. These parameters can already be determined during the performance of the test.

A further advantage of the electrical test circuit consists in that it can be implemented on only a small circuit area and, for example, only requires a fraction of the circuit area of a dynamic A/D converter. The electrical test circuit is, therefore, very economic and inexpensive because it comprises a much smaller circuit area than the circuit area of an inbuilt self-test which must be applied during the sine wave fitting method or when digital filters are used. With regard to the test time, too, the electrical test circuit has a distinct advantage compared with the conventional acquisition and evaluation of test data on a tester.

The test circuit according to the invention is also suitable for low-cost testers in which the test signal and the reference signal can only be generated in digital form. In this arrangement, the difference signal and the quality parameters are also provided in digital form by the electrical test circuit.

According to an advantageous development of the test circuit according to the invention, the control device comprises a control loop circuit which continuously corrects the deviation of the test signal from the reference signal. In this arrangement, the control loop circuit is constructed in such a manner that a deviation-corrected test signal is generated in that the difference values between the deviation of the test signal and of the reference signal are added together and in that the test signal is corrected with this aggregate difference value. Providing such a control loop circuit makes it possible to achieve very accurate measurement results.

According to a further embodiment of the invention, the control device has an amplitude correction circuit by means of which the amplitude of the reference signal can be matched to the amplitude of the test signal. The amplitude correction circuit generates an amplitude-corrected reference signal by the absolute value of the deviation-corrected test signal first being determined and added together and the reference signal being corrected, particularly multiplied, by this aggregate absolute value of the deviation-corrected test signal. This makes it possible to improve the accuracy of the test results obtained even further.

It is particularly advantageous if the control loop circuit and the amplitude correction circuit continuously correct the deviation and the amplitude, respectively.

When the control device also comprises a phase displacement circuit, the phase of the reference signal can be matched very accurately to the phase of the test signal. This makes it possible to improve the quality of the measurement results achieved even further.

Such a phase displacement circuit can comprise, for example, a shift register, a decoder, at least one bus driver and at least one D-type flip flop. It is already sufficient for the accuracy of the measurement results achieved if the phase displacement circuit is capable of displacing the phase of the reference signal up to one half signal period.

A test circuit according to the invention, in which the measuring device is constructed in such a manner that it can add together the squares of the amounts of the difference values between the deviation-corrected test signal and the amplitude- and phase-corrected reference signal or store the minimum and maximum values of the difference values between the deviation-corrected test signal and the amplitude- and phase-corrected reference signal, already comprises a high degree of measuring functionality. To calculate the standard deviation, it is advantageously possible to access the values already calculated or noted.

A particularly accurate adjustment of the phase of the reference signal can be achieved when this phase can be set by the phase displacement circuit with respect to the minimum of the standard deviation determined.

In one embodiment, the invention also relates to an electrical phase displacement circuit for correcting the phase of a reference signal with respect to a test signal of an integrated circuit, particularly of an A/D converter or of a Sigma/Delta converter. Such a phase displacement circuit comprises a first input for receiving a reference signal and a second input for receiving a clock pulse signal from a tester. Furthermore, such a phase displacement circuit has at least one bus driver which is connected to at least one D-type flip flop provided for displacing the phase of the reference signal. A shift register and a selection element connected to the shift register, particularly a decoder, in each case controls one of these bus drivers in dependence on the data stored in the shift register. The phase-displaced reference signal can be sent out via a first output connected to the bus drivers and a control signal can be sent out via a second output.

An electrical circuit according to the invention for the tolerance tube test of integrated circuits, particularly of dynamic A/D converters, comprises an electrical test circuit, described above, and an electrical phase displacement circuit, described above. In this arrangement, the first output of the electrical phase displacement circuit is connected to the third input of the electrical test circuit and the second output of the electrical phase displacement circuit is connected to the second input of the electrical test circuit. Such an electrical circuit can be used for effectively calculating the abovementioned quality parameters at speed in the time domain, the test signal or the reference signal being deviation-, amplitude- and phase-corrected. This results in particularly accurate measuring results.

The invention also relates to an integrated circuit which contains at least one of the circuits described above, namely the electrical test circuit or the electrical phase displacement circuit, particularly as add on in addition to the normal circuit.

The invention also relates to a probe card for testing integrated circuits, in which a circuit described above is integrated.

The invention also relates to a tester-specific load board with test sockets for inserting integrated circuits or for receiving such a probe card or for connecting a handler, at least one electrical circuit described above being integrated on the load board. Such a load board can also be called an adaptor board.

The invention also relates to a measuring device or, respectively, a tester with measuring sensors, for example for currents and for voltages, and with instruments for generating digital signals or data streams. In this arrangement, at least one electrical circuit described above is contained on the measuring device.

If the tester additionally has a low-pass filter, low-cost testers operating exclusively with digital data can also be used. The low-pass filter converts the digital signal received from the tester or, respectively, the digital data stream into an analog signal and applies this signal to the integrated circuit to be tested.

An electrical circuit described above can also be constructed on a tester which can generate analog signals directly and apply them to an integrated circuit.

According to a further basic concept of the invention, the electrical circuit according to the invention can be provided in all embodiments described above in a simple and very space-saving manner on all possible circuits or devices at each level of abstraction and, respectively, on each measuring device plane. This does not result in any impairments of the operation. The expert can obtain the actual embodiment of the objects described above with one of the electrical circuits described above completely and unambiguously from the information contained in this patent specification and from his expert knowledge. It is only necessary to pay attention to the fact that the electrical circuit must be provided in each case in addition to the circuits contained on the objects mentioned above.

The invention also relates to a method for testing an integrated circuit. In this method, a tester is first equipped with an integrated circuit and then current and voltage values are applied to the integrated circuit. At the same time, the tester generates a reference signal which corresponds to the ideal output signal of the integrated circuit. Then, the phase of the reference signal is displaced in such a manner that the reference signal and the test signal of the integrated circuit vary essentially synchronously. After that, the amplitude of the reference signal is matched to the amplitude of the test signal and the deviation of the test signal to the reference signal. In the next step, a reference signal is formed by subtracting the reference signal from the test signal. The difference signal is then evaluated either by the electrical test circuit and/or by the tester.

This method according to the invention makes it possible to evaluate integrated circuits with only little computing effort even during the actual test. The phase correction, the amplitude correction and the deviation correction and the forming of the difference signal can be performed with an electrical test circuit described above and with an electrical phase displacement circuit described above.

When a quality value already described above is formed by the electrical test circuit or by the tester, the functional capability of the integrated circuit tested can already be read from this directly. Even more precise information on the functional capability of the integrated circuit tested can be obtained if the SNR, SNDR, TUE or TAE, already described above, are determined by the electrical test circuit or by the tester. In this process, analog current and voltage values can be applied to the integrated circuit. The method according to the invention is particularly well suited for testing dynamic A/D converters and Sigma/Delta converters but is expressly not restricted to these integrated circuits.

In addition, the tester can contain a conversion unit, particularly a low-pass filter which converts digital data generated by the tester into analog current and voltage values and applies these to the integrated circuit. In this case, conventional low-cost testers operating purely digitally can be used for the method according to the invention.

The invention is also realized in a computer program for executing the method for testing an integrated circuit. The computer program contains program instructions which cause a computer system to execute such methods of an embodiment described above. During this process, in particular, the method steps are controlled by the tester by means of a computer system or performed on a computer system itself, beginning with the method step of applying current and voltage values to the integrated circuit. The computer program outputs as a result the quality values and/or the variables SNR, SNDR, TUE and TAE on an output unit, particularly on a screen or on a printer. The computer program according to the invention makes it possible to test integrated circuits rapidly, effectively and reliably.

The invention also relates to a computer program which is contained on a storage medium, particularly in a computer memory or in a random access memory or which is transmitted on an electrical carrier signal. The invention also relates to a carrier medium, particularly a data medium such as, for example, a floppy disk, a zip drive, a streamer, a CD or a DVD on which a computer program described above is stored. Furthermore, the invention relates to a computer system on which such a computer program is stored. Finally, the invention also relates to a downloading method in which such a computer program is downloaded from an electronic data network such as, for example, from the Internet to a computer connected to the data network.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
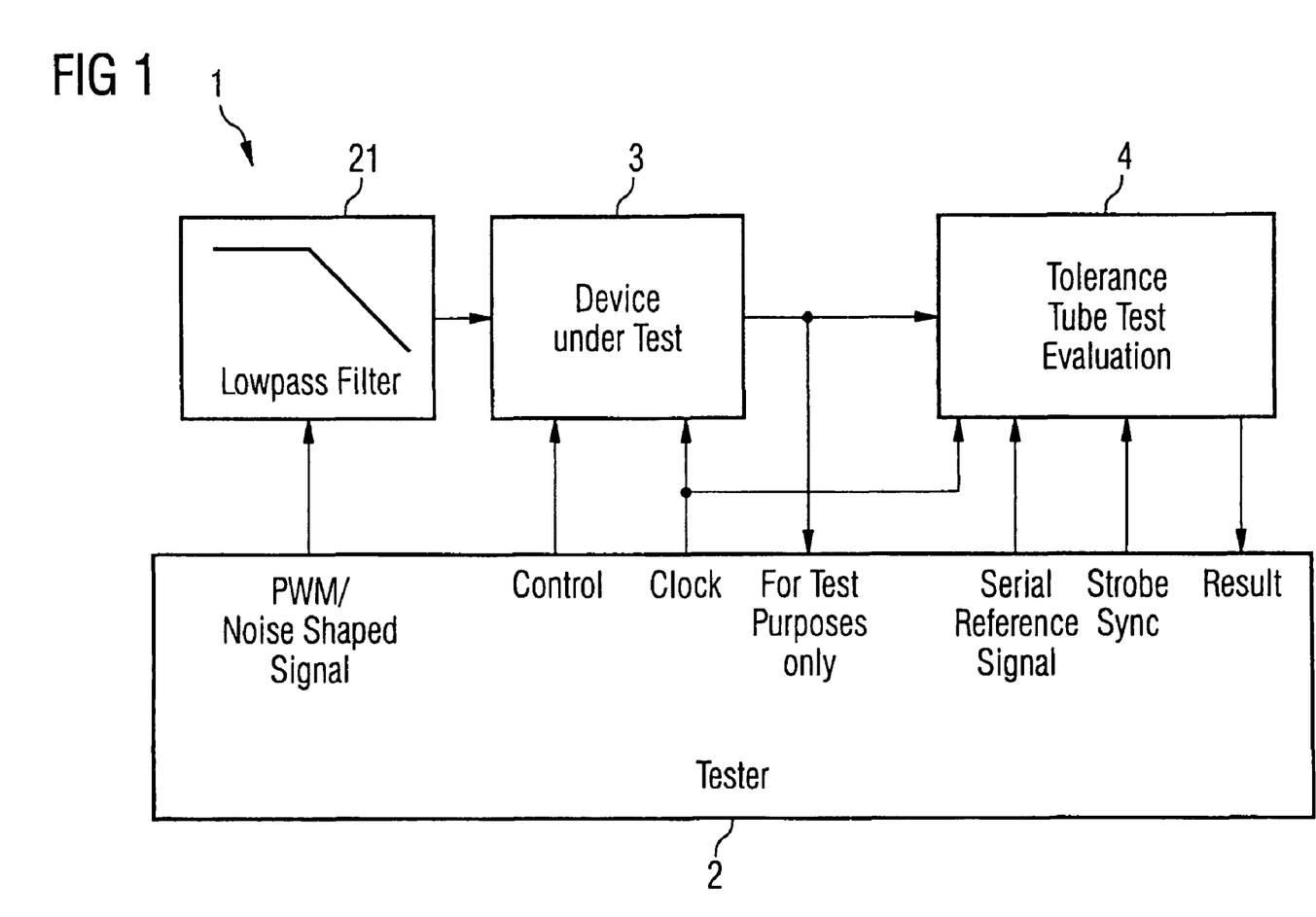
FIG. 1 illustrates a diagrammatic representation of a test set-up with a tester, with a low-pass filter, with an analog/digital converter and with a tolerance tube test circuit.

FIG. 1 illustrates a diagrammatic representation of a test set-up 1 with a tester 2, with a low-pass filter 21, with an analog/digital converter 3 and with a tolerance tube test circuit 4, according to one embodiment of the invention.

The tester 2 is a digital tester that generates a digital data stream and transfers the latter via the output, designated by "PWM/Noise Shaped Signal" in FIG. 1, to the low-pass filter 21. Via the output designated by "Control", control data are sent out to the analog/digital converter 3 or, respectively, A/D converter 3 to be tested. The output, designated by "Clock", of the tester 2 represents the clock generator for the A/D converter 3 and for the tolerance tube test circuit 4.

Via the output, designated by "Serial Reference Signal", of the tester 2, an ideal reference signal calculated by the tester 2 is sent to the tolerance tube test circuit 4. This data line is also called the reference signal line. The reference signal is determined by the tester 2 in that the ideal output signal to be generated by the A/D converter 3 in dependence on the digital data stream in each case applied to the "PWM/Noise Shaped Signal" output is precalculated. The tester 2 applies a bit stream via the reference signal line to the tolerance tube test circuit 4 which comprises the reference signal and control information for the tolerance tube test circuit 4.

Via the output, provided with the designation "Strobe Sync", of the tester 2, a "strobe" or, respectively, a clock pulse can be transferred to the tolerance tube test circuit 4. This data line is also called "strobe synchronization" data line.

The low-pass filter 21 transforms the digital data stream received from the tester 2 into an analog signal and during this process clips off the noise. This analog signal is applied to the A/D converter 3 which, in dependence on this analog input signal, supplies an output signal designated as test signal in the text which follows. This test signal is forwarded both to the tester 2 and to the tolerance tube test circuit 4.

The tolerance tube test circuit 4 generates from this test signal a result value which is finally provided to the tester 2 for further evaluation. The deviation, the amplitude and the standard deviation can be read out again via the result data line in a bit stream from the tester 2.

In the present exemplary embodiment, the tolerance tube test circuit 4 is constructed on the tester 2. The interface between the tester 2 and the tolerance tube test circuit 4 comprises only four data lines, it being possible to use the "clock" data line and the "strobe synchronization" data line for testing the A/D converter 3.

The complexity of the entire tolerance tube test circuit 4 only amounts to approximately 1000 gates.

Figure 2:
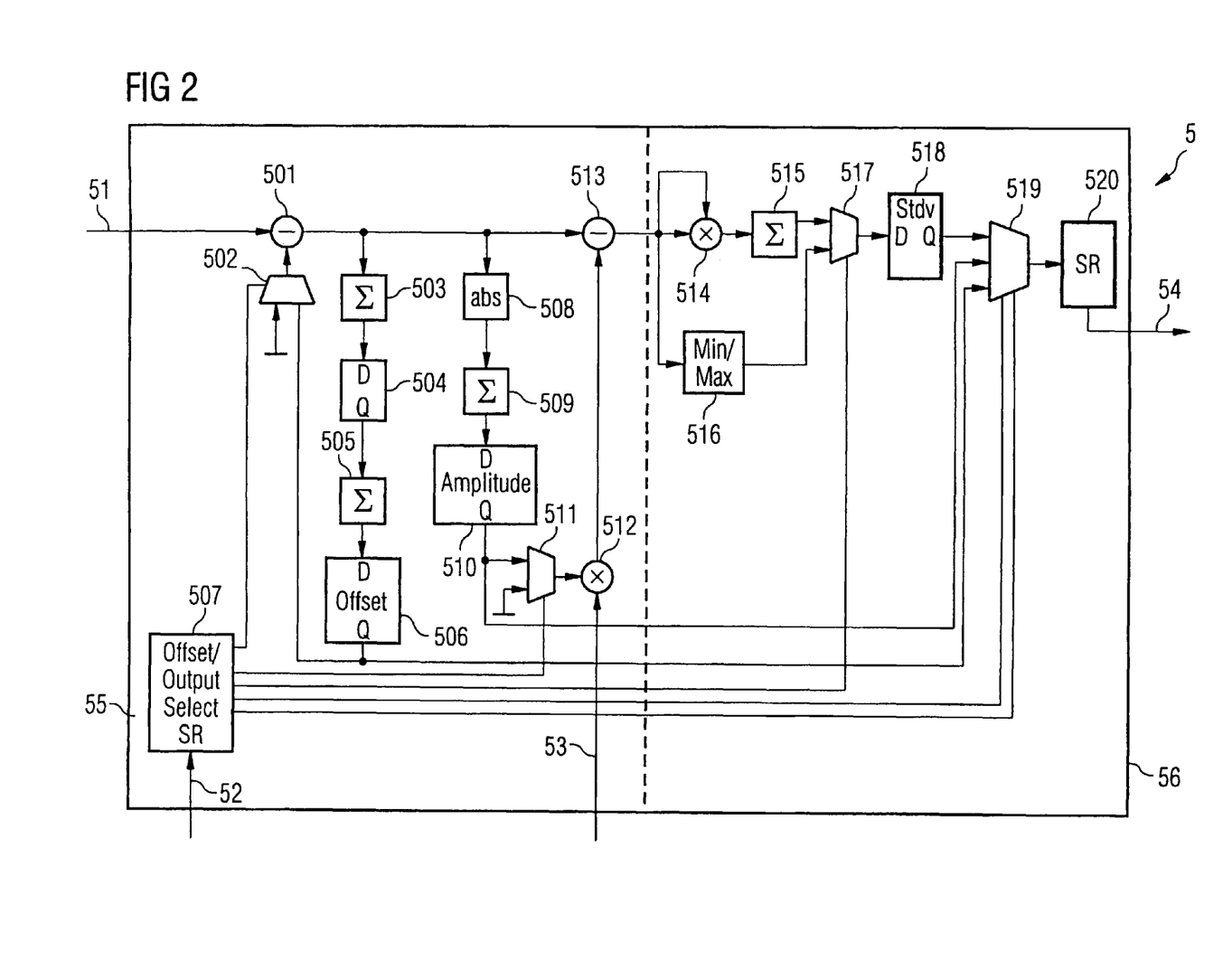
FIG. 2 illustrates a circuit diagram of a test circuit of the tolerance tube test circuit.
Figure 3:
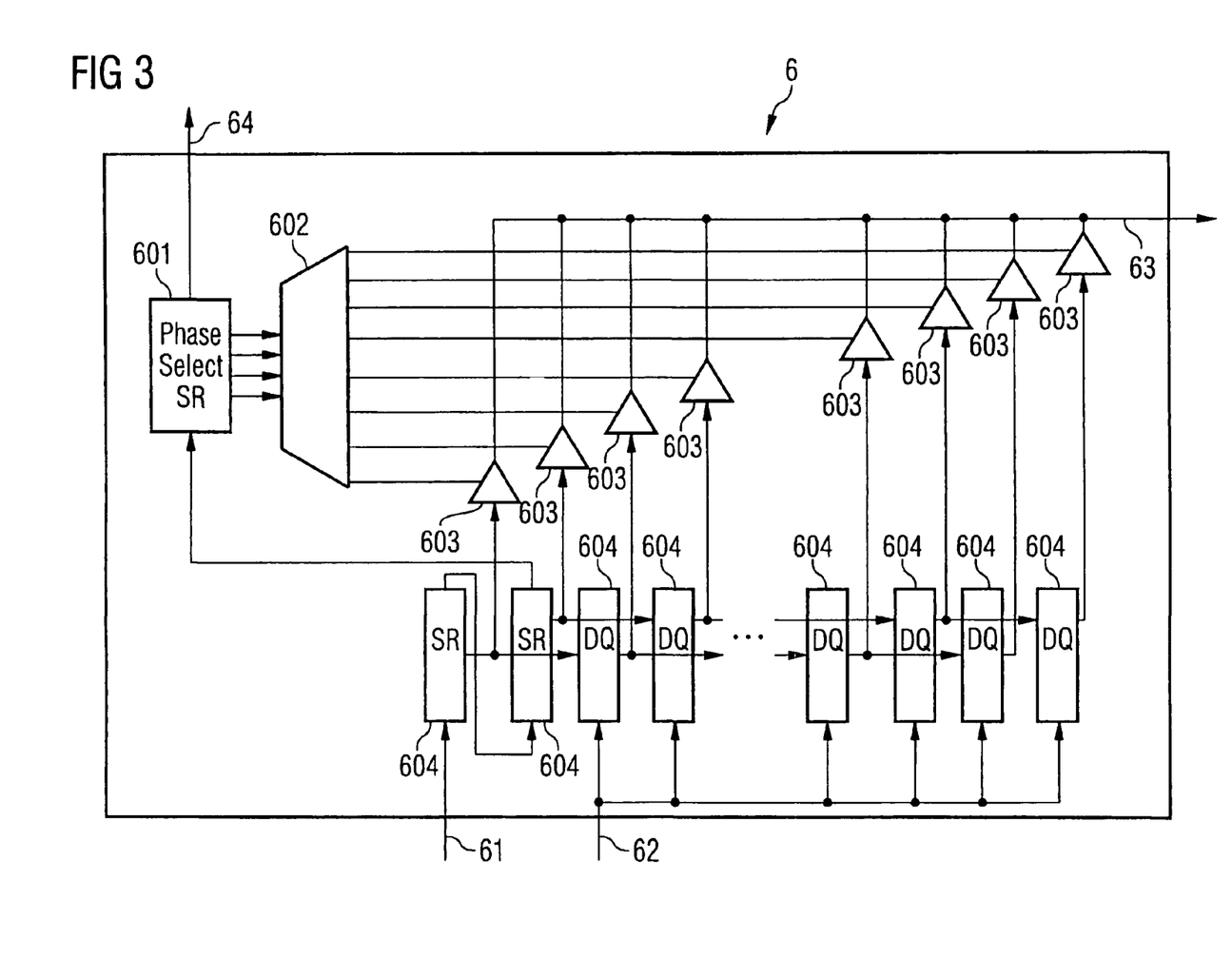
FIG. 3 illustrates a circuit diagram of a phase displacement circuit of the tolerance tube test circuit.

FIG. 2 illustrates a circuit diagram of a test circuit 5 and FIG. 3 shows a circuit diagram of a phase displacement circuit 6.

In this arrangement, the test circuit 5 and the phase displacement circuit 6 together form the tolerance tube test circuit 4 shown in FIG. 1.

The test circuit 5 is divided into a control circuit 55 which forms the left-hand half of the test circuit 5 in FIG. 2, and into a measuring circuit 56 which forms the right-hand half of the test circuit 5 in FIG. 2.

The test signal of the A/D converter 3 reaches the test circuit 5 via a test signal input 51. A control signal from the phase displacement circuit 6 passes via a control signal input 52 to the control element 507 "Offset/Output Select SR".

A first reference signal input 53 leads the reference signal from the phase displacement circuit 6 to the test circuit 5.

The control circuit 55 comprises a control loop circuit with a first subtractor 501, with a first multiplexer 502, with a first adder 503, with a first memory 504, with a second adder 505, with a second memory 506 and with the control element 507. The first subtractor 501 subtracts the deviation from the zero value or, respectively, the offset from the test signal.

This deviation is formed by the first adder 503, by the first memory 504, by the second adder 505 and by the second memory 506. During this process, the difference values between the current deviation and the given deviation are added together.

These aggregate difference values are then conducted from the first multiplexer 502 controlled by the control element 507 to the first subtractor 501. After a test period, when the test signal has passed through the control loop circuit with a particular number, the given deviation of the test signal is corrected by adding this difference value.

The control loop circuit accordingly forms mean values of the test signal over time. The deviation of the test signal present at the test signal input 51 is calibrated by subtracting these mean values.

The first multiplexer 502 and all other multiplexers mentioned hereafter can also be constructed as a gate which can open and shut the line to the subsequent circuit element in each case.

The control circuit 55 also provides an amplitude correction circuit by means of which the amplitude of the reference signal reaching the control circuit 55 via the first reference signal input 53 can be matched to the amplitude of the test signal present at the test signal input 51. The amplitude correction circuit comprises an absolute-value generator 508, a third adder 509, a third memory 510, a second multiplexer 511, a first multiplier 512 and the control element 507. No control loop is provided.

The absolute-value generator 508 forms the absolute value of the test signal. The third adder 509 then forms all sums via the absolute value. This results in the amplitude, which corresponds to an RMS value. This calculated amplitude value is stored in the third memory 510 and multiplied by the reference signal by means of the first multiplier 512. The reference signal thus amplitude-corrected now has the same amplitude as the test signal. In this manner, no correction factor is needed, especially since the magnitude of the reference signal can be selected. The second multiplexer 511 of the amplitude correction circuit, like the first multiplexer 502 of the control loop circuit, is controlled by the control element 507.

In the amplitude correction circuit, the absolute value of the difference is accordingly added together in a large adder. In this arrangement, the MSB can be incremented in the form of a counter. After a test period, the MSB directly contains the amplitude.

The accuracy of the deviation and of the reference signal is formed to be greater than the resolution of the A/D converter 3. The necessary accuracy can be estimated by simulation by means of the present test circuit 5 during the design phase.

The reference signal thus amplitude-corrected is subtracted from the deviation-corrected test signal by means of a second subtractor 513. This is a form of gain correction. After the subtraction performed by the second subtractor 513, a deviation- and gain-corrected signal remains which corresponds to the noise component of the original test signal. During this process, the tone of the test signal was completely removed without having influenced the amplitude of the noise signal contained. This deviation- and gain-corrected signal is then processed by the measuring circuit 56.

In this arrangement, firstly a second multiplier 514 is provided which multiplies this signal by itself. Following this, this signal is added together by a fourth adder 515. This results in the square of the amount of the original signal. The first multiplier 512 and the second multiplier 514 can be provided in the form of an adder and of a shift register because the "clock" frequency is formed to be much higher than the "strobe" frequency. In the present exemplary embodiment, the reference signal is slower by a factor of 24 than the signal of the "clock".

In parallel to this, the extreme-value marker 516, through which the signal passes, in each case stores the minimum value and the maximum value of all deviation- and gain-corrected test signals.

In a third multiplexer 517, controlled by the control element 507, a selection of the square of the amount, of the minimum value and of the maximum value of the deviation- and gain-corrected signal is made. In a standard-deviation generator 518, which then follows, the standard deviation is formed from the value selected in each case. In a fourth multiplexer 519 arranged thereafter, which is also controlled by the control element 507, a value is selected from the standard deviation formed, from the value of the control loop circuit formed and from the value of the amplitude correction circuit formed. This value selected in the fourth multiplexer 519 is then stored in the fourth memory 520 and output via the signal output 54 and provided for further processing, especially by the tester 2.

The deviation of the test signal is continuously corrected by the control loop circuit, and the amplitude of the reference signal is continuously corrected by the amplitude correction circuit.

The phase displacement circuit 6 has a second reference signal input 61 which is connected to the "Serial Reference Signal" output of the tester 2, to be seen in FIG. 1. Furthermore, the phase displacement circuit 6 has a clock pulse input 62 which is connected to the output "Strobe Sync" of the tester 2. The phase displacement circuit 6 has a total of eight series-connected D-type flip flops 604 which provide a complete word. Each of these D-type flip flops 604 is in each case connected to a bus driver 603 via which the respective D-type flip flop can be activated. These D-type flip flops 604 are arranged in odd-numbered and in even-numbered D-type flip flops.

Furthermore, the phase displacement circuit 6 has a shift register 601 "Phase Select SR" which contains the information on the phase displacement to be executed and the selection of which phase is currently active. This shift register 601 is activated once by the tester 2 in order to write in the ideal value for the phase displacement to be performed. A complete sample interval is needed, therefore, in order to perform one control cycle. Accordingly, the phase displacement is always the same. To obtain an informative test, at least two test cycles must be carried out, accordingly.

To determine this value for the phase displacement, a number of values are investigated at the beginning of the test cycle until the ideal value has been determined. The "Serial Reference Signal", which can be easily seen in FIG. 1, comprises both the reference signal and control information for the phase displacement.

Furthermore, the phase displacement circuit 6 comprises a decoder 602 which is driven by the shift register 601 and selects in accordance with the register value stored in the shift register 601 which bus driver 603 will be activated. The information present at the second reference signal input 61 is shifted further by one flip flop with each clock cycle by the D-type flip flops 604. After it has passed through the necessary number of flip flops 604 in each case, the reference signal is available at the reference signal output 63 delayed but otherwise unchanged. The reference signal output 63 is directly connected to the first reference signal input 53 of the test circuit 5. The control signal output 64 coming from the shift register 601 is connected to the control signal input 52 of the test circuit 5.

The phase angle of the reference signal depends on the adjustment of the delay line and on the low-pass filter 21 used in each case. The phase angle is formed to be fixed and is only calibrated once at the beginning of the test cycle by the phase displacement circuit 6. After that, it is no longer necessary to correct the phase. The phase control circuit 6 is, therefore, not integrated in the actual measuring circuit 56.

The accuracy with which the phase can be displaced corresponds to one half test cycle.

The phase displacement circuit 6 is used for controlling the phase displacement between the test signal and the reference signal. Although this phase can be controlled by the test pattern, it is advantageous, however, due to the length of the test pattern, to control this phase displacement by means of the tolerance tube test circuit 4, particularly by the phase displacement circuit 6. The ideal phase displacement can be determined from the minimum standard deviation of the deviation- and gain-corrected test signal.

Figure 4:
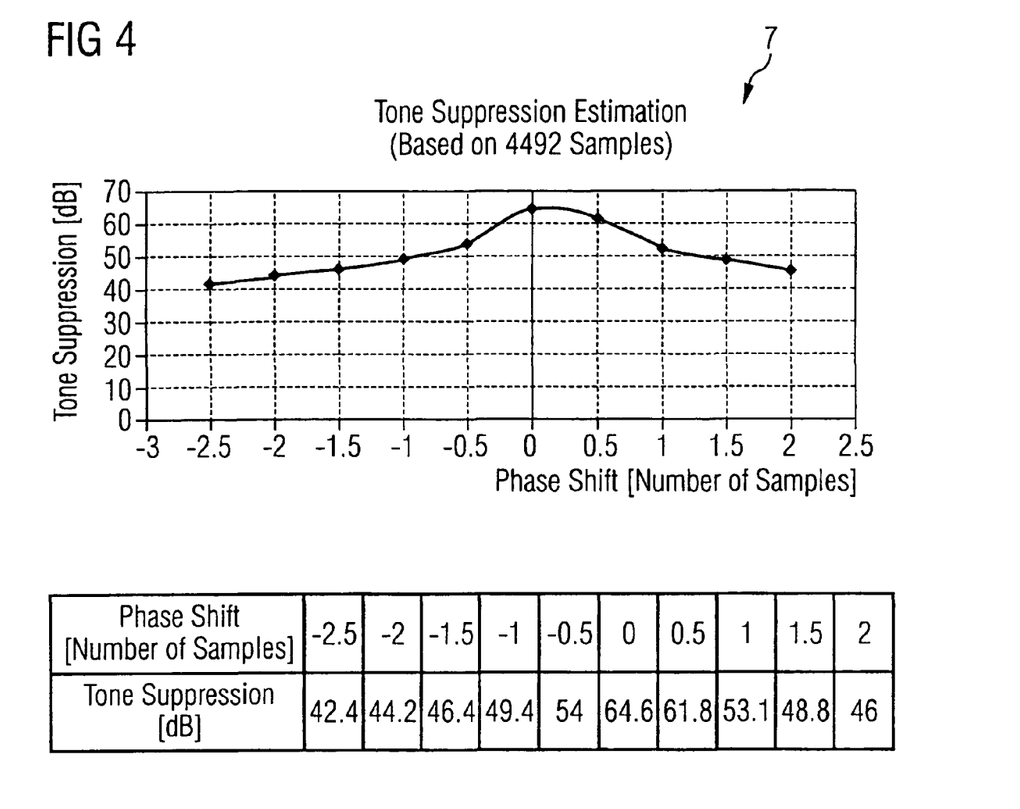
FIG. 4 illustrates a diagram of a simulation result, determined by means of the test set-up from FIG. 1, of the A/D converter from FIG. 1.

FIG. 4 illustrates a diagram of a simulation result 7, determined by means of the test set-up 1, of the A/D converter 3.

In this arrangement, the variable of the phase displacement plotted along the x-axis and the variable plotted along the y-axis correspond to the ratio between the signal and the noise and distortion component of the test signal. This is also called SNDR or, respectively, signal to noise and distortion ratio.

The simulation result 7 shows by way of example the dependence of the SNDR on the phase displacement of the reference signal. FIG. 4 shows easily that the phase displacement of the reference signal has a strong influence on the SNDR. A displacement of the phase of the reference signal by 0.5, that is to say by one half test cycle, is already sufficient for determining the SNDR with adequate accuracy.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An electrical test circuit for testing integrated circuits, particularly dynamic A/D converters, the electrical test circuit comprising:
    a first input configured for receiving a test signal of an integrated circuit;
    a second input configured to receive a normalized reference signal, particularly one that is formed to be synchronous with the test signal;
    a control device configured such that a deviation or an amplitude or a phase of the reference signal or of the test signal is or, respectively, are changed;
    the control device configured to generate a difference signal by subtracting the reference signal from the test signal;
    an output for outputting the difference signal; and
    a measuring device configured to receive the difference signal;
    wherein the control device comprises a control loop circuit which is provided for adapting the deviation of the test signal, the control loop circuit being configured in such a manner that a deviation-corrected test signal is generated in that the difference values between the deviations of the test signal are added together to obtain an aggregate difference value and in that the test signal is corrected by addition with the aggregate difference value.

2. The electrical test circuit according to claim 1, wherein the measuring device is configured to generate at least one quality parameter from the difference signal.

3. The electrical test circuit according to claim 2, wherein the at least one quality parameter is a standard deviation of the test signal or the deviation of the test signal or the amplitude of the test signal.

4. The electrical test circuit according to claim 1, wherein the test signal, the reference signal, the difference signal and a quality parameter or parameters are present in digital form.

5. The electrical test circuit according to claim 1, wherein from the difference signal or from the quality parameter, a ratio between a signal and a noise component of the test signal or the ratio between the signal and the noise or distortion component of the test signal or a total unadjusted error of the test signal or the total adjusted error is calculated.

6. An electrical test circuit for testing integrated circuits, particularly dynamic A/D converters, the electrical test circuit comprising:
    a first input configured for receiving a test signal of an integrated circuit;
    a second input configured to receive a normalized reference signal, particularly one that is formed to be synchronous with the test signal;
    a control device configured such that a deviation or an amplitude or a phase of the reference signal or of the test signal is or, respectively, are changed;

the control device configured to generate a difference signal by subtracting the reference signal from the test signal;
an output for outputting the difference signal; and
a measuring device configured to receive the difference signal;
wherein the control device comprises an amplitude correction circuit for matching the amplitude of the reference signal to the amplitude of the test signal, the amplitude correction circuit including:
an absolute value generator being configured to receive an amplitude-corrected test signal and output an absolute value of the deviation-corrected test signal;
an adder being configured to receive the output of the absolute value generator and output an RMS value of the deviation-corrected test signal;
a memory configured to store the RMS value; and
a multiplier receiving the RMS value from the memory and the reference signal such that the reference signal is corrected with the RMS value of the deviation-corrected test signal.

7. An electrical test circuit for testing integrated circuits, particularly dynamic A/D converters, the electrical test circuit comprising:
a first input configured for receiving a test signal of an integrated circuit;
a second input configured to receive a normalized reference signal, particularly one that is formed to be synchronous with the test signal;
a control device configured such that a deviation or an amplitude or a phase of the reference signal or of the test signal is or, respectively, are changed;
the control device configured to generate a difference signal by subtracting the reference signal from the test signal;
an output for outputting the difference signal; and
a measuring device configured to receive the difference signal;
wherein squares of amounts of difference values between a deviation-corrected test signal and an amplitude- and phase-corrected reference signal are added together by the measuring device or minimum and maximum values of the difference values between the deviation-corrected test signal and the amplitude- and phase-corrected reference signal are stored by the measuring device.

8. The electrical test circuit according to claim 7, wherein the electrical test circuit is configured in such a manner that a standard deviation is calculated by the measuring device from the square of the amounts of the difference values between the deviation-corrected test signal and the amplitude- and phase-corrected reference signal or from the minimum value of the difference values between the deviation-corrected test signal and the amplitude- and phase-corrected reference signal or from the maximum value of the difference values between the deviation-corrected test signal and the amplitude- and phase-corrected reference signal.

9. The electrical test circuit according to claim 7, wherein the electrical test circuit is configured in such a manner that the phase of the reference signal is adjusted in accordance with a minimum of a standard deviation by a phase displacement circuit.

10. A probe card for testing integrated circuits, the probe card comprising:
an electrical test circuit including
a first input configured for receiving a test signal of an integrated circuit;
a second input configured to receive a normalized reference signal, particularly one that is formed to be synchronous with the test signal;
a control device configured such that a deviation or an amplitude or a phase of the reference signal or of the test signal is or, respectively, are changed;
the control device configured to generate a difference signal by subtracting the reference signal from the test signal; and
an output for outputting the difference signal, wherein the control device comprises a phase displacement circuit, the phase displacement circuit being configured in such a manner that the phase of the reference signal is matched to the phase of the test signal; and
the phase displacement circuit comprising:
a first input, for receiving a reference signal from a tester;
a second input for receiving a clock pulse signal from the tester;
at least one bus driver which is coupled to at least one D-type flip flop;
the D-type flip flop being provided for displacing the phase of the reference signal from the tester to a phase-displaced reference signal;
a shift register and a selection element, particularly a decoder, coupled to the shift register, which is formed in such a manner that in each case one bus driver is activated in dependence on the data stored in the shift register,
a first output connected to the bus drivers, which is intended for sending out the phase-displaced reference signal; and
a second output which is intended for sending out a control signal;
wherein the first output of the phase displacement circuit is connected to the second input of the electrical test circuit.

11. A load board for receiving a probe card for testing integrated circuits or with one or more test sockets for testing integrated circuits or for connecting a handler to a tester of integrated circuits, the load board comprising:
an electrical test circuit including
a first input configured for receiving a test signal of an integrated circuit;
a second input configured to receive a normalized reference signal, particularly one that is formed to be synchronous with the test signal;
a control device configured such that a deviation or an amplitude or a phase of the reference signal or of the test signal is or, respectively, are changed;
the control device configured to generate a difference signal by subtracting the reference signal from the test signal; and
an output for outputting the difference signal, wherein the control device comprises a phase displacement circuit, the phase displacement circuit being configured in such a manner that the phase of the reference signal is matched to the phase of the test signal; and
the phase displacement circuit comprising:
a first input, for receiving a reference signal from a tester;
a second input for receiving a clock pulse signal from the tester;
at least one bus driver which is coupled to at least one D-type flip flop;

the D-type flip flop or flip flops are provided for displacing the phase of the reference signal from the tester to a phase-displaced reference signal;

a shift register and a selection element, particularly a decoder, coupled to the shift register, which is formed in such a manner that in each case one bus driver is activated in dependence on the data stored in the shift register, a first output connected to the bus drivers, which is intended for sending out the phase-displaced reference signal; and a second output which is intended for sending out a control signal;

wherein the first output of the phase displacement circuit is connected to the second input of the electrical test circuit.

12. A tester with measuring sensors, particularly for currents and voltages, and with instruments for generating digital signals or data streams, the tester comprising:

an electrical test circuit including
a first input configured for receiving a test signal of an integrated circuit;
a second input configured to receive a normalized reference signal, particularly one that is formed to be synchronous with the test signal;
a control device configured such that a deviation or an amplitude or a phase of the reference signal or of the test signal is or, respectively, are changed;
the control device configured to generate a difference signal by subtracting the reference signal from the test signal; and
an output for outputting the difference signal, wherein the control device comprises a phase displacement circuit, the phase displacement circuit being configured in such a manner that the phase of the reference signal is matched to the phase of the test signal; and the phase displacement circuit comprising
a first input, for receiving a reference signal from a tester;
a second input for receiving a clock pulse signal from the tester;
at least one bus driver which is coupled to at least one D-type flip flop;
the D-type flip flop or flip flops are provided for displacing the phase of the reference signal from the tester to a phase-displaced reference signal;
a shift register and a selection element, particularly a decoder, coupled to the shift register, which is formed in such a manner that in each case one bus driver is activated in dependence on the data stored in the shift register,
a first output connected to the bus drivers, which is intended for sending out the phase-displaced reference signal;
the first output of the electrical phase displacement circuit being connected to the second input of the electrical test circuit; and
a second output which is intended for sending out a control signal.

13. The tester according to claim 12, wherein a low-pass filter is provided which is configured in such a manner that the digital signal received by the low-pass filter or, respectively, the digital data stream received by the low-pass filter is converted into an analog signal.

14. A tester with measuring sensors, particularly for currents and voltages, and with instruments for generating analog signals, the tester comprising:

an electrical test circuit including
a first input configured for receiving a test signal of an integrated circuit;
a second input configured to receive a normalized reference signal, particularly one that is formed to be synchronous with the test signal;
a control device configured such that a deviation or an amplitude or a phase of the reference signal or of the test signal is or, respectively, are changed;
the control device configured to generate a difference signal by subtracting the reference signal from the test signal; and
an output for outputting the difference signal, wherein the control device comprises a phase displacement circuit, the phase displacement circuit being configured in such a manner that the phase of the reference signal is matched to the phase of the test signal; and the phase displacement circuit comprising
a first input, for receiving a reference signal from a tester;
a second input for receiving a clock pulse signal from the tester;
at least one bus driver which is coupled to at least one D-type flip flop;
the D-type flip flop or flip flops are provided for displacing the phase of the reference signal from the tester to a phase-displaced reference signal;
a shift register and a selection element, particularly a decoder, coupled to the shift register, which is formed in such a manner that in each case one bus driver is activated in dependence on the data stored in the shift register,
a first output connected to the bus drivers, which is intended for sending out the phase-displaced reference signal;
the first output of the electrical phase displacement circuit being connected to the second input of the electrical test circuit; and
a second output which is intended for sending out a control signal.

* * * * *